US006876442B2

(12) United States Patent
Vatus et al.

(10) Patent No.: US 6,876,442 B2
(45) Date of Patent: Apr. 5, 2005

(54) METHOD OF CALIBRATING AND USING A SEMICONDUCTOR PROCESSING SYSTEM

(75) Inventors: Jean R. Vatus, San Jose, CA (US); David K. Carlson, Santa Clara, CA (US); Arkadii V. Samoilov, Sunnyvale, CA (US); Lance A. Scudder, Santa Clara, CA (US); Paul B. Comita, Menlo Park, CA (US); Annie A. Karpati, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 572 days.

(21) Appl. No.: 10/078,071

(22) Filed: Feb. 13, 2002

(65) Prior Publication Data

US 2003/0151733 A1 Aug. 14, 2003

(51) Int. Cl.[7] .......................... G01J 5/48; G01R 31/26
(52) U.S. Cl. ................................ 356/43; 438/7; 438/16
(58) Field of Search .......................... 356/43, 51, 630; 438/7, 16; 427/9; 700/121

(56) References Cited

U.S. PATENT DOCUMENTS

| 4,969,748 | A |   | 11/1990 | Crowley et al. |
| 5,258,824 | A | * | 11/1993 | Carlson et al. ............. 356/632 |
| 5,809,211 | A |   | 9/1998  | Anderson et al. |
| 6,130,105 | A | * | 10/2000 | Redinbo et al. .............. 438/16 |
| 6,319,732 | B1 | * | 11/2001 | Dils et al. ....................... 438/7 |
| 6,530,992 | B1 | * | 3/2003  | Yang et al. .................. 118/695 |

FOREIGN PATENT DOCUMENTS

EP              0 859 406 A2    8/1998

* cited by examiner

Primary Examiner—Gregory J. Toatley, Jr.
Assistant Examiner—Roy M. Punnoose
(74) Attorney, Agent, or Firm—Blakely Sokoloff Taylor & Zafman

(57) ABSTRACT

A method is provided wherein a temperature reading error of a pyrometer is avoided. An upper pyrometer is used to detect infrared radiation from a test layer formed on a test substrate under standard processing conditions. The infrared radiation from the test layer has a period having a length which is indicative of growth rate of the layer. The period is generally inversely proportional to the growth rate. The growth rate is directly related to the temperature.

22 Claims, 5 Drawing Sheets

METHOD OF CALIBRATING AND USING A SEMICONDUCTOR PROCESSING SYSTEM

BACKGROUND OF THE INVENTION

1). Field of the Invention

This invention relates to a method of calibrating and using a semiconductor processing system.

2). Discussion of Related Art

Integrated circuits are commonly manufactured in and on semiconductor wafer substrates. A wafer substrate is then sawed into individual dice, each carrying a respective integrated circuit.

Various systems exist for processing wafer substrates. One such system is the Epi Centura® system by Applied Materials, Inc. of Santa Clara, Calif. The Epi Centura® system has a transfer chamber with a number of single-wafer processing chambers leading off the transfer chamber. Each wafer processing chamber is formed by upper and lower quartz windows. Infrared lamps outside the chamber radiate infrared radiation through the quartz windows into the chamber. A susceptor is located within the chamber, upon which a wafer substrate can be located. The wafer substrate can be heated from above, and the susceptor can be heated from below. The susceptor and the wafer substrate are both relatively thin, so that they are approximately the same temperature.

An upper pyrometer is located above the upper quartz window, and a lower pyrometer is located below the lower quartz window. Infrared radiation radiates from a layer formed on the wafer substrate through the upper quartz window to the upper pyrometer. Infrared radiation also radiates from a lower surface of the susceptor through the lower quartz window to the lower pyrometer. The pyrometers generate signals that vary in magnitude according to variations in magnitude of the infrared radiation. The infrared radiation, in turn, is roughly indicative of temperature of the layer and the lower surface of the substrate.

Errors in temperature value occur due to a number of factors. One reason why errors in temperature value occur is because of film deposited within the chamber after repeated use. Layers form on the lower surface of the susceptor and on inner surfaces of the quartz windows. The layer on the susceptor changes its emissivity, resulting in a change in an amount of infrared radiation therefrom, even if temperature remains constant. The layers on the quartz windows also attenuate infrared radiation, so that the magnitude of infrared radiation reaching the pyrometers is reduced, even at the same temperature. A further reason why errors in temperature value occur is because of changes in emissivity of a layer formed on some type of wafer substrate. The emissivity of the layer typically can change as it is formed. The change in the emissivity of the layer causes variations in the infrared radiation detected by the upper pyrometer, even at a constant temperature.

BRIEF SUMMARY OF THE INVENTION

A method is provided wherein a temperature error of a pyrometer is bypassed. An upper pyrometer is used to detect infrared radiation from a test layer formed on a test substrate under standard processing conditions. The infrared radiation from the test layer has a period having a length which is indicative of growth rate of the layer. The period is generally inversely proportional to the growth rate. The growth rate is directly related to the temperature. The period is thus inversely proportional to the temperature. A set of reference data of reference periods against real temperatures is stored in a computer. The period of the infrared radiation when forming the test layer is compared with the reference data to determine the real temperature. The real temperature is then compared with the desired temperature to determine a difference in temperature between the real temperature and the desired temperature. The difference in temperature is then used to calculate an effective modified emissivity due to contamination. The desired temperature and the modified emissivity are then used to control heating of a susceptor when forming an actual process layer on a process substrate.

BRIEF DESCRIPTION OF THE DRAWINGS

The invention is further described by way of example with reference to the accompanying drawings, wherein.

DETAILED DESCRIPTION OF THE INVENTION

Apparatus

Figure 1:
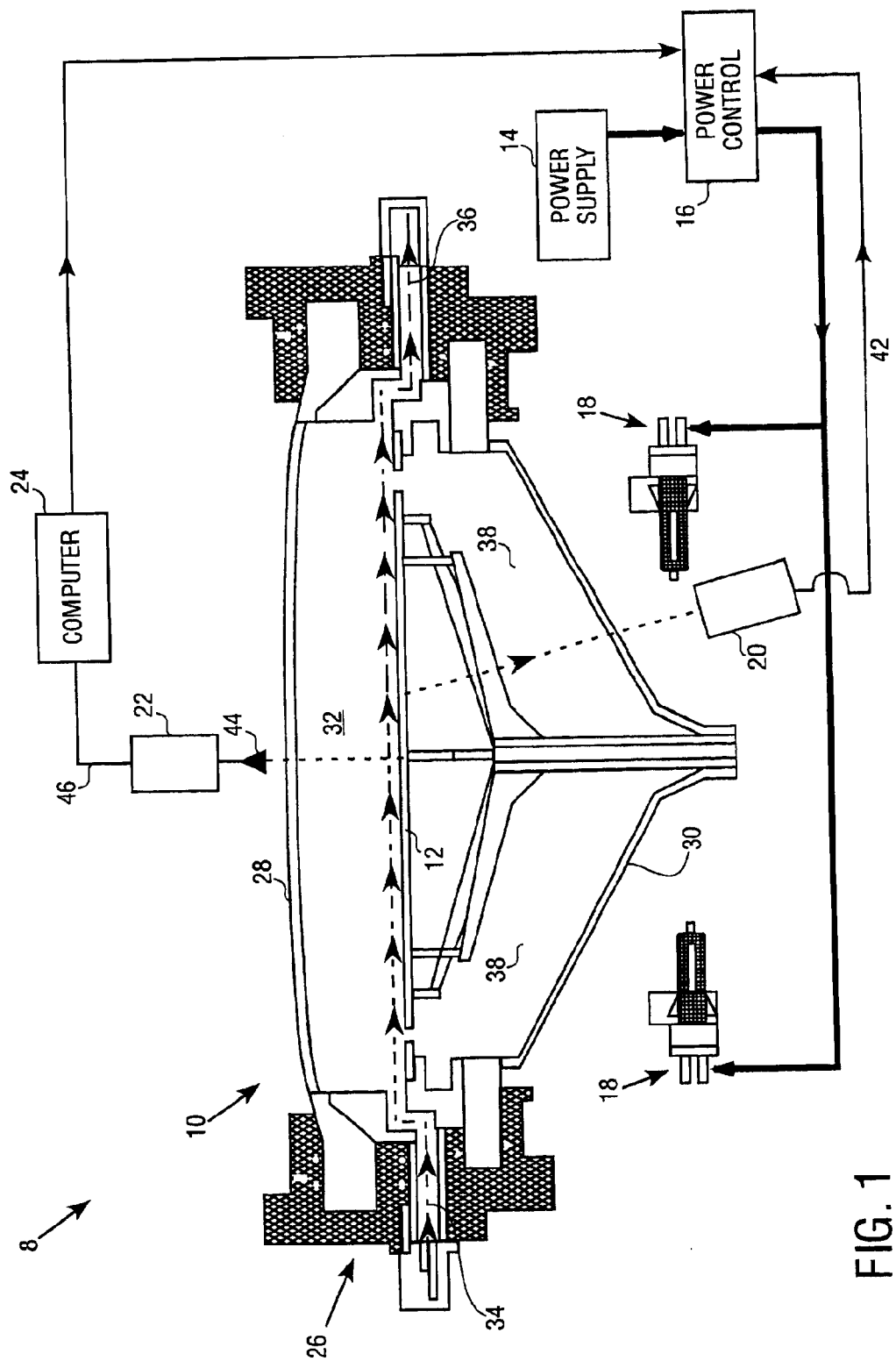
FIG. 1 is a cross-sectional side view of components of a semiconductor processing system used for carrying out the method of the invention.

FIG. 1 of the accompanying drawings illustrates a semiconductor processing system (8) which is used for carrying out a method according to the invention. The system (8) includes a semiconductor processing chamber (10), a susceptor (12) within the chamber (10), a power supply (14), a power control (16), infrared lamp heaters (18), a lower pyrometer (20), an upper pyrometer (22), and a computer (24).

The chamber (10) includes a base ring (26), an upper quartz window (28), and a lower quartz window (30). The quartz windows (28) and (30) have peripheries that seal with the base ring (26). The base ring (26), together with the quartz windows (28) and (30), define an internal volume (32). A gas inlet (34) is formed through the base ring (26) into the internal volume (32), and a gas outlet (36) is formed out of the internal volume (32) on a side of the internal volume (32) opposing the gas inlet (34). A slit valve opening (not shown) is formed through the base ring (26). A wafer substrate can be inserted into and later be removed from the internal volume (32) through the slit valve opening. The susceptor (12) is mounted in a substantially horizontal orientation within the internal volume (32). The wafer substrate can be located on top of the susceptor (12).

The power supply (14) is connected through a power control (16) to the heaters (18). Electric power can be provided from the power supply (14) through the power control (16) to the heaters (18). The power control (16) can vary an amount of electric power provided to the heaters (18). The heaters (18) radiate infrared radiation (38) through the lower quartz window (30) onto a lower surface of the susceptor (12). More heaters may be located above the upper quartz window (28) and radiate into the internal volume (32).

The lower pyrometer (20) is located below the lower quartz window (30). Infrared radiation (40) radiates from the lower surface of the susceptor (12) through the lower quartz window (30). The lower pyrometer (20) is located in a position to receive the infrared radiation (40). The infrared radiation (40) tends to increase when a temperature of the susceptor (12) increases, and decrease when the temperature of the susceptor (12) decreases. The pyrometer (20) generates a signal (42) in response to the infrared radiation (40). The signal (42) increases if the infrared radiation (40) increases, and decreases when the infrared radiation (40) decreases. The power control (16) is connected to the pyrometer (20), so that the signal (42) is provided to the power control (16). The power control (16) is connected between the power supply (14) and the heaters (18) and can utilize the signal (42) to maintain the temperature of the susceptor (12) steady and constant.

In use, a wafer substrate is inserted into the internal volume (32) and located on top of the susceptor (12). The slit valve closes the slit valve opening through which the wafer is inserted into the internal volume (32). A pump (not shown) connected to the gas outlet (36) is operated so that the internal volume (32) is maintained at a required, constant pressure. The susceptor (12) heats the wafer substrate to a processing wafer temperature. Processing gases are then introduced through the gas inlet (34). The processing gases flow at a constant rate over an upper surface of the wafer substrate and then out of the gas outlet (36). The gases combine with one another and deposit a layer on top of the wafer substrate according to conventional principles relating to chemical vapor deposition. The rate at which the layer forms depends on the pressure within the internal volume (32) and the temperature of the wafer substrate.

Infrared radiation (44) radiates from the layer formed on the wafer substrate through the upper quartz window (28). The upper pyrometer (22) is located in a position wherein it receives the infrared radiation (44). The upper pyrometer (22) is connected to the computer (24). The upper pyrometer (22) generates a signal (46) in response to the infrared radiation (44). The signal (46) increases when a magnitude of the infrared radiation (44) increases, and decreases when a magnitude of the infrared radiation (44) decreases.

A magnitude of the infrared radiation (44) depends on two factors: (i) the temperature of the layer that is formed on the wafer substrate, and (ii) the emissivity of the layer that is formed on the wafer substrate. The emissivity changes as the layer is formed, so that the magnitude of the infrared radiation (44) changes as the layer is formed, even at a constant temperature. The magnitude of the infrared radiation (44) is thus not a good indicator of the temperature of the layer. However, the inventors have found that the magnitude of the infrared radiation (44) is cyclical. As will be described in more detail below, the cyclical nature of the magnitude of the infrared radiation (44) is used to determine growth rate of the layer. The growth rate of the layer can be used to determine temperature of the layer indirectly.

Lower Pyrometer Calibration

The emissivity of the susceptor (12) changes as films are deposited thereon. A layer on the lower quartz window (30) also attenuates infrared radiation therethrough. For purposes of further discussion, the effect of the layer on the lower quartz window (30) is combined with the emissivity of the susceptor (12). Although reference hereinafter is made to the emissivity of the susceptor (12), it should be understood that it is the effective emissivity of the combination of the real emissivity of the susceptor (12) and the effect of the layer on the lower quartz window (30).

Figure 2:
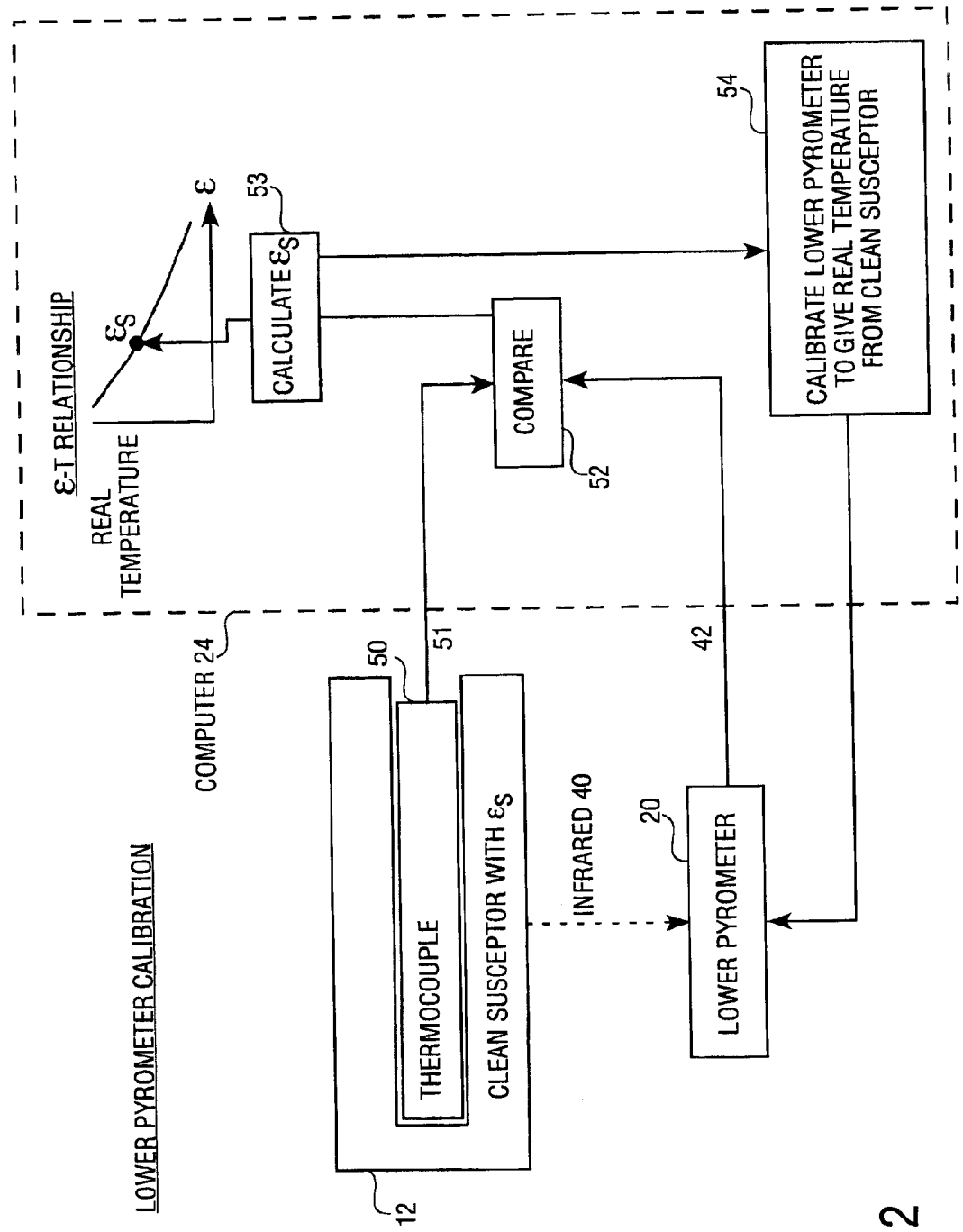
FIG. 2 is a block diagram illustrating components of the system that are used for calibrating a lower pyrometer thereof.

FIG. 2 illustrates how the lower pyrometer is calibrated and an initial emissivity value, $\epsilon_s$, of the initial clean susceptor (12) is obtained.

A thermocouple (50) is inserted into the susceptor (12), and the susceptor (12) is heated to a temperature of, for example, 660° C. The thermocouple (50) provides a signal (51) to the computer (24). The thermocouple (50) is calibrated so that the signal (51) provides an accurate indication of the temperature of the susceptor (12).

The signal (42) of the lower pyrometer (20) is compared with the signal (51) from the thermocouple (50). The signal (42) is dependent on the degree of the infrared radiation (40). The degree of infrared radiation (40) depends on the temperature of the susceptor (12) and its emissivity $\epsilon_s$. The magnitude of the signal (42) is thus a function of the temperature of the susceptor (12) and its emissivity $\epsilon_s$. The signal (51) provides an indication of the temperature of the susceptor (12), so that the only variable to be calculated is the emissivity $\epsilon_s$ of the susceptor (12). The signals (42) and (51) are then compared (52), and the emissivity $\epsilon_s$ is calculated (53). The lower pyrometer (20) is then calibrated (54) using the calculated emissivity $\epsilon_s$. A functional $\epsilon$-T relationship is also stored in the computer (24). The $\epsilon$-T relationship is represented as a curve of real temperature T against emissivity $\epsilon$. The real temperature is generally inversely proportional to the emissivity $\epsilon$. Should the emissivity of the susceptor (12) increase and a magnitude of the signal (42) remain the same, it would translate that the temperature of the susceptor (12) has decreased. What is important to note is that the curve provides a slope of real temperature against emissivity $\epsilon$ near the emissivity $\epsilon_s$.

Generation of Reference Data

A number of reference substrates (56) are located on the susceptor (12) while it is still new, and thus has an emissivity $\epsilon_s$. The reference substrates (56) are located after one another on the susceptor (12) and their respective reference layer (57) is formed on a respective reference substrate (56). Because the lower pyrometer (20) is calibrated, and because the susceptor (12) still has its original emissivity $\epsilon_s$, the signal (42) can still be used to accurately determine the real temperature on the lower surface of the susceptor (12). The signal (42) is provided to the computer (24). The signal (42) is also provided to the power control (16), which maintains the heaters (18) at a steady power, so that the heaters (18) create a steady heat flux over the susceptor (12). The steady heat flux maintains the susceptor (12) at a constant temperature.

Infrared radiation (44) simultaneously transmits to the upper pyrometer (22). Because the emissivity of the reference layer (57) changes as it forms, the signal (46) also changes correspondingly. As the reference layer (57) begins to form, the signal (46) increases from a starting value, then decreases to the starting value, then decreases further, and then increases to the starting value. The signal (46) thus has a magnitude which is periodic. A length of time of a period of the signal (46) is the length of time that it takes for the magnitude of the signal (46) to return to its original value a second time. It has been found that the reference layer (57) has the same thickness every time the magnitude of the signal (46) returns to its original value the second time. The length of the period of the signal thus provides an indication of the growth rate of the reference layer (57). A longer period indicates a slower growth rate and a shorter period indicates a faster growth rate. The signal (46) is provided to the computer (24).

The computer (24) has a clock (58). The computer (24) determines when the magnitude of the signal (46) returns to its original level the second time, and then utilizes the clock (58) to determine a length of time for the signal (46) to return to its original value the second time. A data point is then stored in the computer (24), which relates the reference period from the signal (46) to the real temperature in the signal (42). Thus, for a reference substrate N, the real temperature N has a specific reference period N.

The reference substrate N (56) is then removed from the susceptor (12) out of the chamber (10), and another reference substrate, N+1, is then inserted into the chamber (10) and on the susceptor (12). The susceptor (12) and the reference substrate N+1 are then heated to a temperature different to the real reference temperature when forming the prior reference layer on the prior reference substrate N. The real reference temperature N+1 is then related to the reference period N+1 for the reference substrate N+1.

By repeating the process for subsequent reference substrates, a consolidated set of reference data is created, with different reference periods related to different real temperatures. The reference periods are generally inversely proportional to the real temperatures of the different reference substrates. Therefore, the higher the real temperature, the shorter the period (and the faster the growth rate).

Forming a Test Layer on a Test Substrate

Reference is again made to FIG. 1. Subsequent use of the system (8) creates layers on inner surfaces of the quartz windows (28) and (30). The layer on the upper quartz window (28) further reduces the ability of the upper pyrometer (22) to accurately determine a temperature of a layer formed on a substrate on the susceptor (12). Furthermore, the layer on the lower quartz window (30) affects the magnitude of the infrared radiation (40), so that when the infrared radiation (40) reaches the lower pyrometer (20), it has a lower magnitude than when the lower pyrometer (20) was calibrated. Film deposition on the lower surface of the susceptor (12) also changes its emissivity. The lower pyrometer (20) thus "misreads" the temperature on the lower surface of the susceptor (12).

However, the upper pyrometer (22) can still detect a period in the magnitude of the infrared radiation (44). The period in the magnitude of the infrared radiation (44) is indicative of a growth rate of the layer which, in turn, is indicative of the temperature of the layer. The period at the signal (46) can thus be compared with the periods in the reference data to determine the real temperature of the layer, provided that all other processing conditions are the same.

Figure 3:
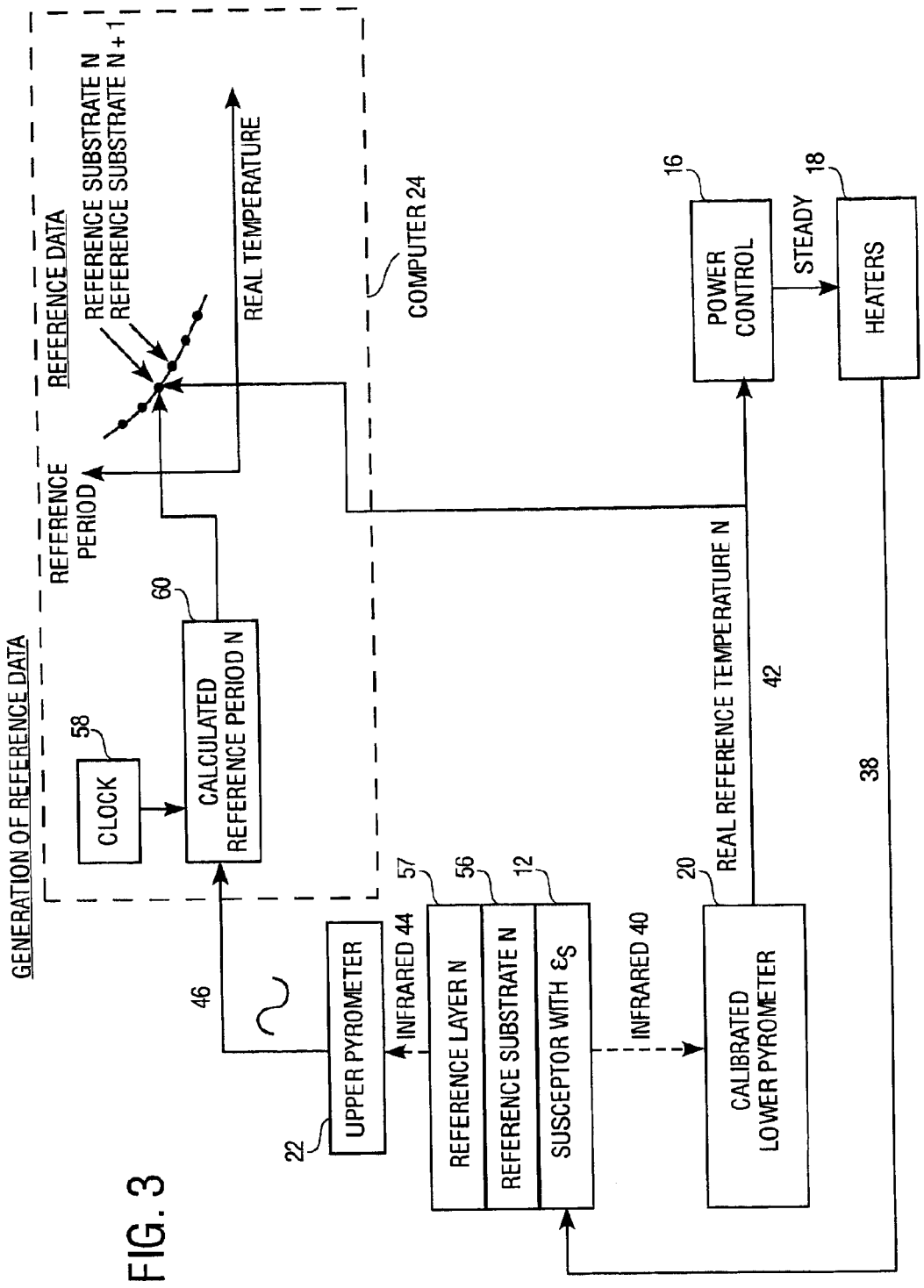
FIG. 3 is a block diagram of components of the system that are used for generating reference data of reference periods against a real temperature of a signal received by an upper pyrometer of the system.
Figure 4:
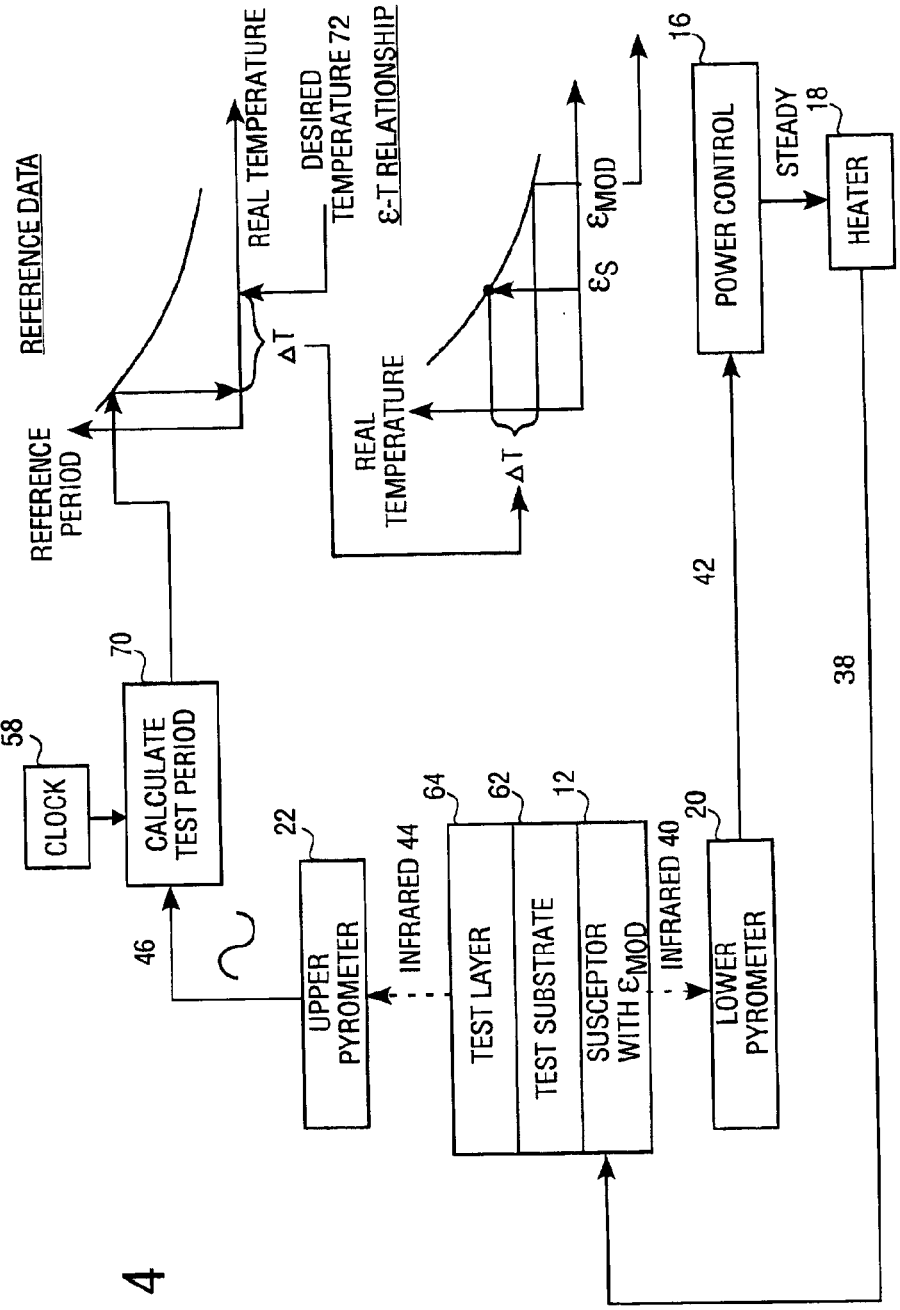
FIG. 4 is a block diagram of components of the system that are used for calculating a value of a modified emissivity after contamination on the susceptor and other contamination on the system.

FIG. 4 illustrates how the formation of a test layer on a test substrate can be used to determine the temperature of the susceptor (12), for purposes of further modification of power provided to the susceptor (12). A test substrate (62) is located on the susceptor (12), and a test layer (64) is formed on the test substrate (62). The conditions for forming the test layer (64) are the same as the conditions for forming the reference layer (57) in FIG. 3. Total pressure, partial pressure of gases, the types of gases used, and the flow rates are the same when forming the test layer (64) than when forming the reference layer (57) and, as when forming the reference layer (57), are maintained at constant levels. The only difference is that the emissivity of the susceptor (12) changes to a modified emissivity $\epsilon_{mod}$ because of contamination on the susceptor (12). The signal (42) from the lower pyrometer (20) does not provide an accurate measure of the temperature of the susceptor (12). The signal (42) is still used by the power control (16) to maintain the heaters (18) steady, so that they create a steady heat flux over the susceptor (12), and thus maintain the susceptor (12) at a constant temperature. The intention is to determine $\epsilon_{mod}$ so that the temperature of the susceptor (12) can be determined.

The upper pyrometer (22) detects the infrared radiation (44) from the test layer (64). The computer (24) then again utilizes the signal (46) from the upper pyrometer (22) and the clock (58) to calculate a test period (70) of the signal (46). The length of the test period is again calculated from the moment when the test layer (64) starts to form until when the signal (46) returns to its original value a second time.

The test period is then compared with the reference data generated in FIG. 3. Because all reference periods are related to specific real temperatures, the calculated test period (70) corresponds to a particular real temperature. An operator enters a desired temperature (72) into the computer (24). The computer (24) then subtracts the desired temperature (72) from the real temperature corresponding to the calculated test period (70), and the difference in temperature, ΔT, is the temperature difference by which the susceptor (12) has to be adjusted to the desired temperature (72).

The difference in temperature, ΔT, is then compared with the $\epsilon$-T relationship generated in FIG. 2. Because the slope of the curve of the $\epsilon$-T relationship is known near $\epsilon_s$, $\epsilon_{mod}$ can be determined. $\epsilon_{mod}$ is determined by moving the temperature down the Y-axis by ΔT. ΔT may, for example, be 5° C., and, as mentioned earlier, the temperature at $\epsilon_s$ was 660° C., so that the temperature is moved down to 655° C. $\epsilon_{mod}$ is the emissivity value corresponding to 655° C. $\epsilon_{mod}$ is the emissivity value of the susceptor (12) due to contamination.

Forming a Process Layer on a Process Substrate

Figure 5:
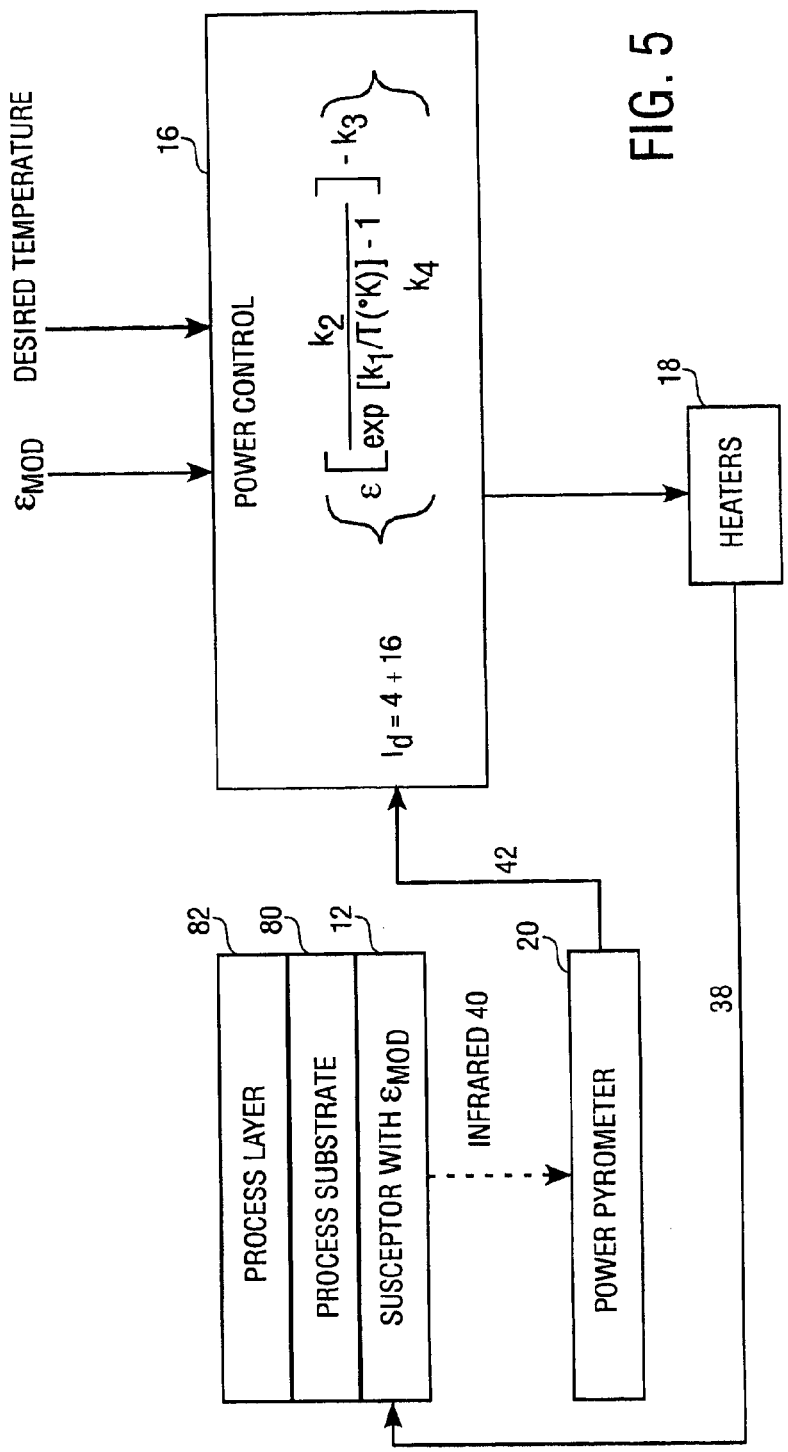
FIG. 5 is a block diagram of components that are used when forming a process layer on a process substrate.

As shown in FIG. 5, the test substrate (62) of FIG. 4 is removed from the susceptor (12), and a process substrate (80) is located on the susceptor (12). A process layer (82) is then formed on the process substrate (80). The process layer (82) can be a totally different layer than the reference layer (57) of FIG. 3 and the test layer (64) of FIG. 4. In fact, all the processing conditions when forming the process layer (82) can be different than when forming the reference layers (57) and the test layer (64). What is important is that the emissivity value $\epsilon_{mod}$ of the susceptor (12) is known, and its temperature can thus be calculated. The signal (42) generated by the lower pyrometer (20) is now dependent on two factors: (i) the temperature of the susceptor (12), and (ii) the emissivity $\epsilon_{mod}$ of the susceptor (12), both of which are known. A relationship exists between the desired signal $I_d$ from the lower pyrometer (20), the emissivity from the susceptor (12), and the desired temperature of the susceptor (12), as illustrated in the power control box (16). The desired signal $I_d$ can be calculated by replacing the emissivity value $\epsilon$ with $\epsilon_{mod}$, and replacing the temperature T with the desired temperature (72) of the susceptor (12), as entered by the operator ($k_1$, $k_2$, $k_3$, and $k_4$ are constants). The power control (16) compares the value of $I_d$ with the signal (42). If the signal (42) is below the value $I_d$, more power is provided to the heaters (18), and vice versa. As such, the susceptor (12) is maintained at a temperature corresponding to the desired temperature (72) entered by the operator.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A method, comprising:
   measuring a test variable of a test layer formed on a test substrate in a processing chamber;
   using the test variable to select a reference process condition in a consolidated data set of reference variables against reference process variables, a location of the reference process condition among the reference process variables depending on a location of the test variable among the reference variables; and forming a process layer on a process substrate in a processing chamber, a process variable to form the process layer being based on the reference process condition.

2. The method of claim 1, wherein the test variable is indicative of growth rate of the test layer.

3. The method of claim 2, wherein the test variable is indicative of a length of a period of a signal from a pyrometer detecting infrared radiation from the test layer.

4. The method of claim 3, wherein the test variable is a length of a first period of the signal starting when the test layer begins to form.

5. The method of claim 1, wherein the process variable affects heat flux over a surface of the process substrate.

6. The method of claim 5, wherein the process variable is power which is provided to a heater.

7. A computer-implemented method, comprising:

measuring a test variable of a test layer formed on a test substrate in a processing chamber;

using the test variable to select a reference process condition in a consolidated data set of reference variables against reference process variables, a location of the reference process condition among the reference process variables depending on a location of the test variable among the reference variables; and forming a process layer on a process substrate in a processing chamber, a process variable to form the process layer being based on the reference process condition.

8. The method of claim 7, wherein the process variable is computer-selected.

9. A method, comprising:

setting a heater to create a test heat flux over a test substrate in a substrate processing chamber;

forming a test layer on the surface while the heater creates the test heat flux over the surface of the test substrate;

comparing a test variable indicative of growth rate of the test layer with a reference variable indicative of growth rate of a reference layer when a reference heat flux is created over a surface of a reference substrate;

inserting a process substrate into the processing chamber;

setting the heater to create a process heat flux over a surface of the process substrate, the process heat flux being selected based upon the comparison of the test variable with the reference variable;

forming a process layer on the surface of the process substrate while the heater creates the process heat flux over the surface of the process substrate; and removing the process substrate from the processing chamber after the process layer is formed.

10. A method comprising:

setting a heater to create a test heat flux over a surface of a test substrate in a processing chamber;

forming a test layer on the surface of the test substrate while the heater creates the test heat flux over the surface of the test substrate;

utilizing a pyrometer to detect infrared radiation from the test layer while the test layer is being formed, the pyrometer generating a signal varying with variations in magnitude of the infrared radiation;

calculating a test value indicative of a length of a period of the signal;

selecting a desired process value from date of different reference process values;

accessing a desired reference value from the date corresponding to the desired process value and differing from reference values corresponding to other ones of the process values;

comparing the test value with the desired reference value;

adjusting the heater based upon said comparison;

inserting a process substrate into the processing chamber, the heater heating the process substrate after said adjustment;

forming a process layer on the process substrate while being heated by the heater; and removing the process substrate from the processing chamber into which the process substrate is inserted.

11. The method of claim 10, wherein the test layer is formed while maintaining a test pressure and a concentration of a gas of a material out of which the test layer is formed at constant levels.

12. The method of claim 11, wherein a magnitude of the heat flux over the surface of the test substrate is maintained constant while forming the test layer.

13. The method of claim 10 wherein temperature of the surface of the test substrate remains constant while forming the test layer, the test layer having an emissivity that changes while the test layer is being formed.

14. The method of claim 10, wherein the pyrometer is located externally of the chamber in which the test substrate is located when the test layer is being formed, the chamber having a wall of a material through which the infrared radiation radiates.

15. The method of claim 10, wherein the test value is a length of time that it takes for the signal to return to an initial value a second time.

16. The method of claim 15, wherein the test value is a length of time of a first period of the test signal starting when the test layer begins to form.

17. The method of claim 16, wherein a magnitude of the signal increases when the degree of infrared radiation increases, and decreases when the degree of infrared radiation decreases.

18. The method of claim 10, wherein the different process values of the data are different power level settings.

19. The method of claim 10, wherein the test value and the reference value are compared to determine a difference between them.

20. The method of claim 10, wherein the test value is a length of a period of the signal and the heater is adjusted by either increasing heat flux from the heater if the test value is more than the desired reference value, or decreasing heat flux from the heater if the test value is less than the desired reference value.

21. The method of claim 10, further comprising:

compiling the data prior to forming the test layer on the test substrate.

22. The method of claim 21, wherein the data is compiled by repeatedly:

(i) inserting a reference substrate into a processing chamber;

(ii) adjusting a process variable to a reference process value;

(iii) forming a reference layer on the reference substrate;

(iv) calculating a reference value of the reference layer; and (v) recording both the reference process variable and the reference value in a manner that relates them to one another.

* * * * *